United States Patent
Kim et al.

(10) Patent No.: US 9,876,500 B2
(45) Date of Patent: Jan. 23, 2018

(54) SEMICONDUCTOR CIRCUIT

(71) Applicant: SAMSUNG ELECTRONICS CO., LTD., Suwon-si, Gyeonggi-do (KR)

(72) Inventors: Ah Reum Kim, Daegu (KR); Min Su Kim, Hwaseong-si (KR); Chung Hee Kim, Yongin-si (KR); Hyun Chul Hwang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/499,257

(22) Filed: Apr. 27, 2017

(65) Prior Publication Data

US 2017/0317676 A1    Nov. 2, 2017

(30) Foreign Application Priority Data

Apr. 28, 2016   (KR) .......................... 10-2016-0052148

(51) Int. Cl.
| | | |
|---|---|---|
| *H03K 19/00* | (2006.01) | |
| *H03K 19/003* | (2006.01) | |
| *H03K 19/20* | (2006.01) | |

(52) U.S. Cl.
CPC ... *H03K 19/0013* (2013.01); *H03K 19/00315* (2013.01); *H03K 19/20* (2013.01)

(58) Field of Classification Search
None
See application file for complete search history.

(56) References Cited

U.S. PATENT DOCUMENTS

| | | | |
|---|---|---|---|
| 6,211,711 B1 | 4/2001 | Laurier et al. | |
| 6,861,876 B1 * | 3/2005 | Argyres | H03K 5/135 326/95 |
| 7,154,319 B2 * | 12/2006 | Kim | H03K 3/0372 327/202 |
| 7,279,935 B2 | 10/2007 | Hamdan et al. | |
| 7,292,672 B2 | 11/2007 | Isono | |
| 7,365,575 B2 | 4/2008 | Kim | |
| 7,525,361 B2 | 4/2009 | Kim | |
| 7,595,665 B2 * | 9/2009 | Park | H03K 19/0016 326/95 |
| 7,902,878 B2 | 3/2011 | Saint-Laurent et al. | |
| 7,994,836 B2 | 8/2011 | Hart et al. | |

(Continued)

*Primary Examiner* — Douglas W Owens
*Assistant Examiner* — James H Cho
(74) *Attorney, Agent, or Firm* — Volentine & Whitt, PLLC

(57) ABSTRACT

A semiconductor circuit includes a first circuit, a second circuit, a third circuit, and a fourth circuit. The first circuit determines a value of a first node based on a voltage level of a clock signal, and a voltage level of an enable signal or a voltage level of a scan enable signal. The second circuit determines a value of a second node based on the voltage levels of the first node and the clock signal. The third circuit determines a value of a third node based on a voltage level of the second node. The fourth circuit determines a value of a fourth node based on the voltage levels of the second node and the clock signal. The third circuit includes a first transistor and a second transistor connected in series with each other and gated to the voltage level of the second node to determine the value of the third node. The fourth circuit includes a third transistor that is gated to the voltage level of the clock signal to electrically connect the third node and the fourth node.

20 Claims, 17 Drawing Sheets

(56) References Cited

U.S. PATENT DOCUMENTS

| | | | |
|---|---|---|---|
| 8,030,982 B2 * | 10/2011 | Datta | H03K 3/356086 |
| | | | 327/211 |
| 8,390,328 B2 | 3/2013 | Myers et al. | |
| 8,890,573 B2 | 11/2014 | Eklin et al. | |
| 8,975,949 B2 | 3/2015 | Berzins et al. | |
| 8,981,815 B2 | 3/2015 | Gururajarao | |
| 2014/0292372 A1 * | 10/2014 | Gururajarao | H03K 19/0013 |
| | | | 326/95 |
| 2015/0200652 A1 | 7/2015 | Berzins et al. | |

* cited by examiner

2

1200

1300

1400

SEMICONDUCTOR CIRCUIT

This U.S. non-provisional patent application claims priority under 35 U.S.C. §119 to Korean Patent Application No. 10-2016-0052148, filed on Apr. 28, 2016 in the Korean Intellectual Property Office, the disclosure of which is incorporated herein by reference in its entirety.

BACKGROUND

1. Technical Field

The present disclosure relates to a semiconductor circuit.

2. Background Information

Miniaturization of processes has resulted in more logic circuits being integrated on a single chip. The power consumption per unit area of the chip gradually increases accordingly. For this reason, a problem of heat generation has emerged as an important issue in electronic devices that employ such a chip.

A flip flop of an operating circuit may be considered a typical element that consumes much power in the electronic device, even when the operation circuit is supplied with a signal clock by a clock gate. It has become very important to reduce the power consumption of such an element and the overall operating circuit integrated on a chip.

SUMMARY

According to an aspect of the present disclosure, a semiconductor circuit is provided in which reliability is improved, and speed is improved, while power consumption is reduced.

According to another aspect of the present disclosure, a semiconductor circuit includes a first circuit, a second circuit, a third circuit, and a fourth circuit. The first circuit determines a value of a first node on the basis of a voltage level of a clock signal, and a voltage level of an enable signal or a voltage level of a scan enable signal. The second circuit determines a value of a second node on the basis of the voltage levels of the first node and the clock signal. The third circuit determines a value of a third node on the basis of a voltage level of the second node. The fourth circuit determines a value of a fourth node on the basis of the voltage levels of the second node and the clock signal. The third circuit includes a first transistor and a second transistor connected in series with each other and gated to the voltage level of the second node to determine the value of the third node. The fourth circuit includes a third transistor that is gated to the voltage level of the clock signal to electrically connect the third node and the fourth node.

According to another aspect of the present disclosure, a semiconductor circuit includes a first node, a second node, a third node, and a fourth node. The first node has a logic level value different from a logic level of an enable signal or logic level of a scan enable signal, when a clock signal is at a first logic level. In the second node, a value is determined by the logic level of the first node when the clock signal is at the first logic level, and the value is maintained by a logic level of a third node when the clock signal is at a second logic level. In the third node, a value is determined by the logic level of the second node. In the fourth node, a value is determined by the logic level of the second node when the clock signal is at the second logic level. The fourth node is discharged through a first transistor gated to the voltage level of the second node to provide a ground voltage to the fourth node, and a second transistor gated to the voltage level of the clock signal to electrically connect the third node and the fourth node.

According to still another aspect of the present disclosure, a semiconductor circuit includes a first logic gate, a second logic gate, a first transistor and a second transistor, and a third logic gate. The first logic gate receives input of a clock signal, and an enable signal or a scan enable signal, and performs a first logic operation to output a first output signal to a first node. The second logic gate receives input of the first output signal of the first logic gate, the clock signal and the signal of a third node, and performs a second logic operation to output a second output signal to a second node. The first transistor and second transistor are gated to the voltage level of the second output signal of the second logic gate and are connected in series with each other to determine the value of the third node. The third logic gate receives input of the second output signal of the second logic gate and the clock signal and performs a third logic operation to output a third output signal to a fourth node. The third transistor is gated to the voltage level of the clock signal to electrically connect the third node and the fourth node.

However, aspects of the present disclosure are not restricted to the ones set forth herein. The above and other aspects of the present disclosure will become more apparent to one of ordinary skill in the art to which the present disclosure pertains by referencing the detailed description given below.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1:
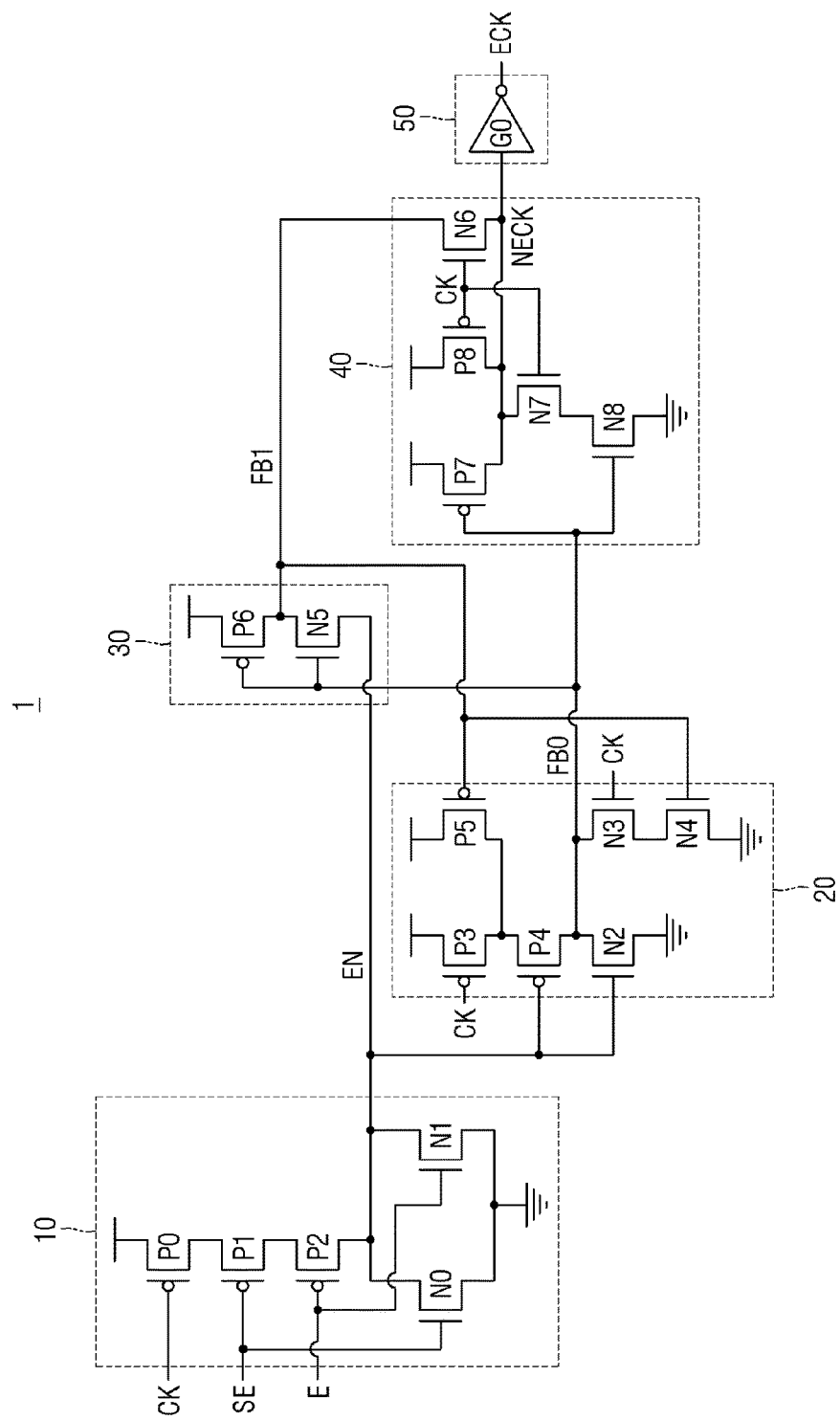
FIG. 1 is a circuit diagram for explaining a semiconductor circuit according to an embodiment of the present disclosure.

Embodiments will be described in detail with reference to the accompanying drawings. The concepts described herein, however, may be embodied in various different forms, and should not be construed as being limited only to the illustrated embodiments. Rather, these embodiments are provided as examples so that this disclosure will be thorough and complete, and will fully convey the concepts described herein to those skilled in the art. Accordingly, known processes, elements, and techniques are not described with respect to some of the embodiments of the present disclosure. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the concepts described herein. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Advantages and features of the present disclosure and methods of accomplishing the same may be understood more readily by reference to the following detailed description of preferred embodiments and the accompanying drawings.

FIG. 1 is a circuit diagram for explaining a semiconductor circuit according to an embodiment of the present disclosure.

Referring to FIG. 1, a semiconductor circuit 1 according to an embodiment of the present disclosure includes a first circuit 10, a second circuit 20, a third circuit 30 and a fourth circuit 40. In some embodiments of the present disclosure, the semiconductor circuit 1 may further include an output circuit 50.

The first circuit 10 determines a value of a first node EN on the basis of a voltage level of a clock signal CK, and on a voltage level of an enable signal E or a voltage level of a scan enable signal SE.

Specifically, the first circuit 10 includes transistors P0, P1 and P2. A transistor P0 is gated to the voltage level of the clock signal CK to provide the power supply voltage to the transistor P1. The transistor P1 is connected in series with the transistor P0 and is gated to the voltage level of the scan enable signal SE to provide the power supply voltage to the transistor P2. The transistor P2 is connected in series with the transistor P1 and is gated to the voltage level of the enable signal E to provide the power supply voltage to the first node EN.

Further, the first circuit 10 includes transistors N0 and N1. The transistor N0 is gated to the voltage level of the scan enable signal SE to provide a ground voltage to the first node EN. The transistor N1 is gated to the voltage level of the enable signal E to provide the ground voltage to the first node EN.

In this embodiment, the transistors P0, P1 and P2 are P-type transistors, and the transistors N0 and N1 may be N-type transistors.

In this embodiment, although the first circuit 10 is illustrated as receiving the input of the enable signal E and the scan enable signal SE, the first circuit 10 may be modified to receive only the enable signal E as the input or to receive only the scan enable signal SE as the input. Thus, the first circuit 10 may be provided to include only the transistors P1 and N0 (i.e., but not P2 or N1) that receive only the input of the scan enable signal SE so that the transistor P1 is directly connected to the first node EN. Alternatively, the first circuit 10 may be provided to include only the transistors P2 and N1 (i.e., but not P1 or N0) that receive only the input of the enable signal E so that the transistor P2 is directly connected to the transistor P0. Such modifications are within the capability of those of ordinary skill in the art.

The second circuit 20 determines the value of the second node FB0 on the basis of the voltage level of the first node EN and the clock signal CK.

Specifically, the second circuit 20 includes transistors P3, P4 and P5. The transistor P3 is gated to the voltage level of the clock signal CK to provide the power supply voltage to the transistor P4. The transistor P5 is connected in parallel with the transistor P3 and is gated to the voltage level of the third node FB1 to provide the power supply voltage to the transistor P4. The transistor P4 is connected in series with the transistors P3 and N2 (explained below) and is gated to the voltage level of the first node EN to provide the power supply voltage to the second node FB0.

Further, the second circuit 20 includes transistors N2, N3 and N4. The transistor N2 is gated to the voltage level of the first node EN to provide the ground voltage to the second node FB0. The transistor N4 is gated to the voltage level of the third node FB1 to provide the ground voltage to the transistor N3. The transistor N3 is connected in series with the transistor N4 and is gated to the voltage level of the clock signal CK to provide the ground voltage to the second node FB0.

In the present embodiment, the transistors P3, P4 and P5 are P-type transistors, and the transistors N2, N3 and N4 may be N-type transistors.

The third circuit 30 determines the value of the third node FB1, based on the voltage level of the second node FB0.

Specifically, the third circuit 30 includes transistors P6 and N5. The transistor P6 is gated to the voltage level of the second node FB0 to provide the power supply voltage to the third node FB1. The transistor N5 is also gated to the voltage level of the second node FB0, but to provide the ground voltage to the third node FB1. That is, the transistors P6 and N5 are connected in series with each other to determine the value of the third node FB1 depending on the voltage level of the second node FB0.

In the present embodiment, the transistor P6 is a P-type transistor, and the transistor N5 may be an N-type transistor.

The fourth circuit 40 determines the value of the fourth node NECK, on the basis of the voltage levels of the second node FB0 and the clock signal CK.

Specifically, the fourth circuit 40 includes transistors P7 and P8. The transistor P7 is gated to the voltage level of the second node FB0 to provide the power supply voltage to the fourth node NECK. The transistor P8 is connected in parallel with the transistor P7 and is gated to the voltage level of the clock signal CK also to provide the power supply voltage to the fourth node NECK.

Further, the fourth circuit 40 includes transistors N6, N7 and N8. The transistor N6 is gated to the voltage level of the clock signal CK to electrically connect the third node FB1 and the fourth node NECK. The transistor N8 is gated to the voltage level of the second node FB0 to provide the ground voltage to the transistor N7. The transistor N7 is connected in series with the transistor N8 to provide the ground voltage to the fourth node NECK.

In the present embodiment, the transistors P7 and P8 are P-type transistors, and the transistors N6, N7 and N8 may be N-type transistors.

The output circuit 50 may be designed as needed, depending on the object(s) of the semiconductor circuit 1 for the various embodiments of the present disclosure. In the present embodiment, the output circuit 50 may include an inverter G0. The inverter G0 receives the input of the voltage level of the fourth node NECK and outputs an inverted voltage level.

Hereinafter, a logic level of a certain signal transmitted from the semiconductor circuit 1 according to various embodiments of the present disclosure will be represented by a first logic level L and/or a second logic level H, or is simply represented by L and H. A person having ordinary skill in the art will recognize that the values of the first logic level and the second logic level are not limited to specific values, and may vary depending on the objects of the semiconductor circuit 1 for the various embodiments of the present disclosure. That is, the values of the first logic level and the second logic level may have each of the values of the logic low L and logic high H, depending on the purpose of the circuit. The values of the first logic level and the second logic level may also have each of the values of the logic high H and the logic low L.

Figure 2:
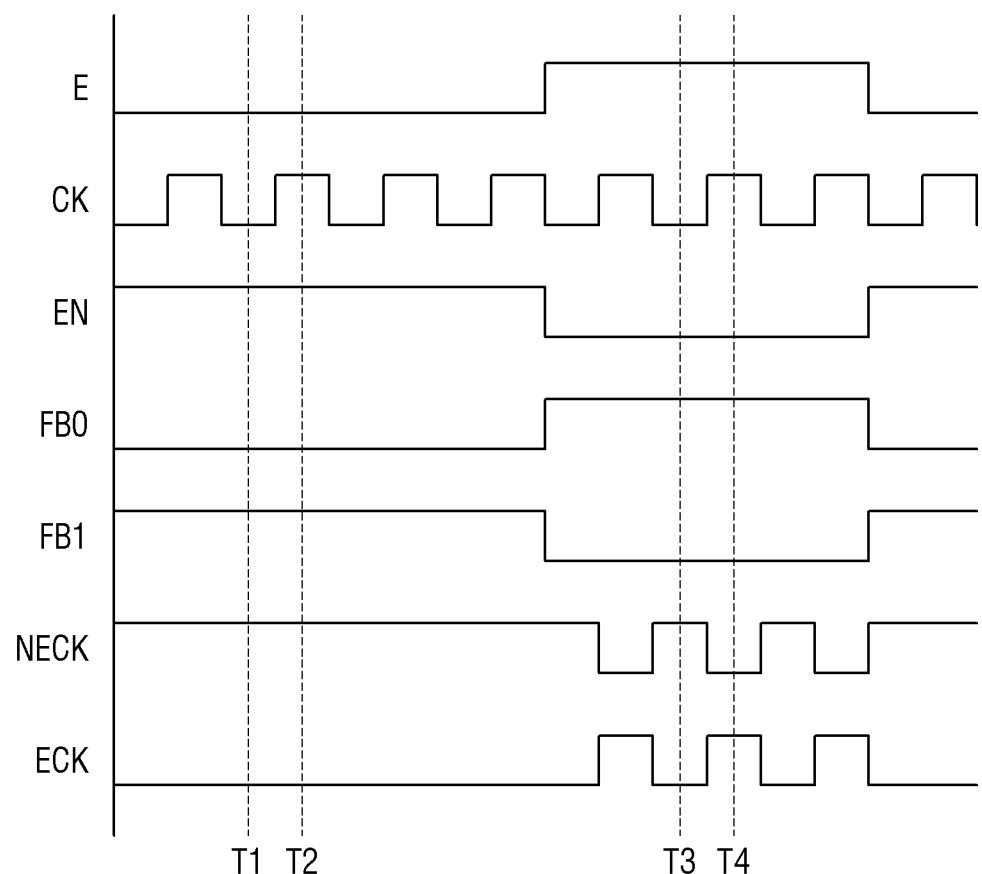
FIGS. 2 and 3 are timing diagrams for explaining the operation of the semiconductor circuit according to an embodiment of the present disclosure.
Figure 3:
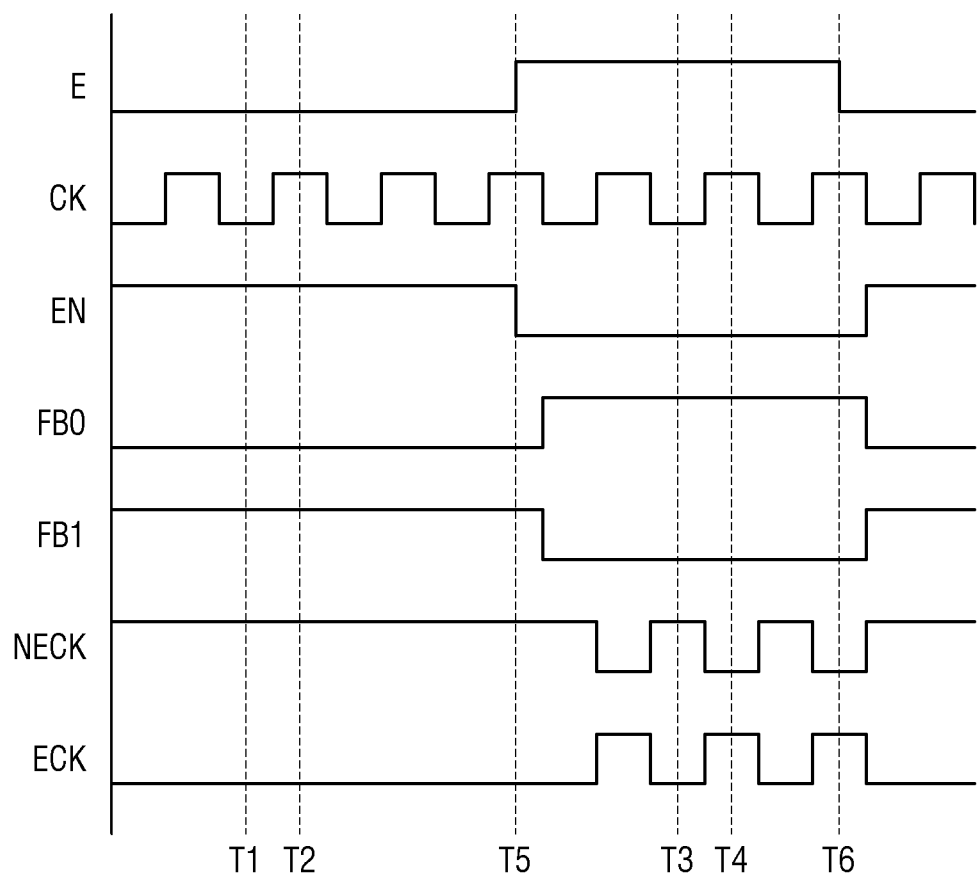

FIGS. 2 and 3 are timing diagrams for explaining the operation of the semiconductor circuit according to an embodiment of the present disclosure.

Referring to FIG. 2, the semiconductor circuit 1 according to an embodiment of the present disclosure receives the input of the clock signal CK, and outputs the gated clock signal ECK depending on the value of the enable signal E.

FIG. 2 illustrates the operation of the semiconductor circuit 1 with a change in the value of the enable signal E from the first logic level L to the logic level H, assuming that the scan enable signal SE is kept constant at the first logic level L. However, the description of the present embodiment may also be similarly applied to the operation of the semiconductor circuit 1 when the value of the scan enable signal SE changes. That is, the description of the present embodiment may also be similarly applied to a case where the value of the scan enable signal SE changes from the first logic level L to the second logic level H, assuming that the enable signal E is maintained constant at the first logic level L. Hereinafter, for the convenience of explanation, the operation of the semiconductor circuit 1 with the change in the value of the enable signal E will be mainly described. The repeated description of the operation of the semiconductor circuit 1 depending on the change in the value of the scan enable signal SE, which operates similarly to the enable signal E, will not be provided.

At times T1 and T2, the enable signal E corresponds to the first logic level L. The logic levels of the first node EN, the second node FB0, the third node FB1 and the fourth node NECK may be each of H, L, H, and H respectively.

At times T3 and T4, the enable signal E corresponds to the second logic level H. The logic levels of the first node EN, the second node FB0 and the third node FB1 may be each of L, H and L respectively. The logic level of the fourth node NECK may become inverted to the logic level of the clock signal CK.

That is, when the enable signal E corresponds to the first logic level L, the semiconductor circuit 1 according to various embodiments of the present disclosure maintains the gated clock signal ECK at the first logic level L, by maintaining the logic level of the fourth node NECK at the second logic level H.

When the enable signal E corresponds to the second logic level H, when the logic level of the clock signal CK is the first logic level L, the semiconductor circuit 1 according to various embodiments of the present disclosure maintains the logic level of the fourth node NECK still at the second logic level H. When the enable signal E corresponds to the second logic level H, when the logic level of the clock signal CK becomes the second logic level H, the semiconductor circuit 1 causes the gated clock signal ECK to follow the waveform of the clock signal CK by transitioning the logic level of the fourth node NECK to the first logic level L.

Referring to FIG. 3, the semiconductor circuit 1 according to an embodiment of the present disclosure can perform the stable clock gating operation, without being greatly influenced by the time at which the value of the enable signal E changes during operation.

FIG. 3 illustrates the operation of the semiconductor circuit 1 with the change in the value of the enable signal E from the first logic level L to the second logic level H, assuming that the scan enable signal SE is kept constant at the first logic level L. However, as described above in connection with FIG. 2, the description of the present embodiment may also be similarly applied to the operation of the semiconductor circuit 1, when the value of the scan enable signal SE changes from the first logic level L to the second logic level H, assuming that the enable signal E is kept constant at the first logic level L.

Referring to the time T5, the enable signal E transitions from the first logic level L to the second logic level H as the clock signal CK is maintained at the second logic level H.

In this case, the transistor N1 gated by the voltage level of the enable signal E is turned on, and the logic level of the first node EN transitions to L.

At this time, the voltage level of the clock signal CK corresponds to the second logic level H, the voltage level of the third node FB1 corresponds to the second logic level H, and the voltage level of the second node FB0 corresponds to the first logic level L. The second node FB0 is still discharged, by the transistor N3 being turned-on as a result of being gated to the voltage level of the clock signal CK (H) and by the transistor N4 being turned-on as a result of being gated to the voltage level of the third node FB1 (H). As a result, the logic level of the fourth node NECK is continuously maintained at the second logic level H by the transistor P7 gated to the voltage level of the second node FB0 (L).

At time T6, the enable signal E transitions from the second logic level H to the first logic level L as the clock signal CK is maintained at the second logic level H.

In this case, although the transistor P2 gated by the voltage level of the enable signal E (corresponding to the first logic level L) is turned on, because the clock signal CK has a value of the second logic level H, the transistor P0 is not turned on. Therefore, the logic level of the first node EN maintains the first logic level L, before reaching the time at which the clock signal CK transitions from the second logic level H to the first logic level L.

Thus, the second node FB0 still maintains the charge state, by the turned-on transistor P5 gated to the voltage level of the third node FB1 (corresponding to the first logic level L) and the turned-on transistor P4 gated to the voltage level of the first node EN corresponding to the first logic level L. The logic level of the fourth node NECK is still maintained at the first logic level L, by the transistor N8 gated to the voltage level of the second node FB0 (corresponding to the second logic level H) and the transistor N7 gated to the voltage level of the clock signal CK (corresponding to the second logic level H).

The semiconductor circuit 1 according to various embodiments of the present disclosure can perform a stable clock gating operation in a previously described manner.

Hereinafter, a specific operation of the semiconductor circuit 1 will be described with reference to FIGS. 4 to 7.

FIGS. 4 to 7 are circuit diagrams for explaining the operation of the semiconductor circuit according to an embodiment of the present disclosure.

Figure 4:
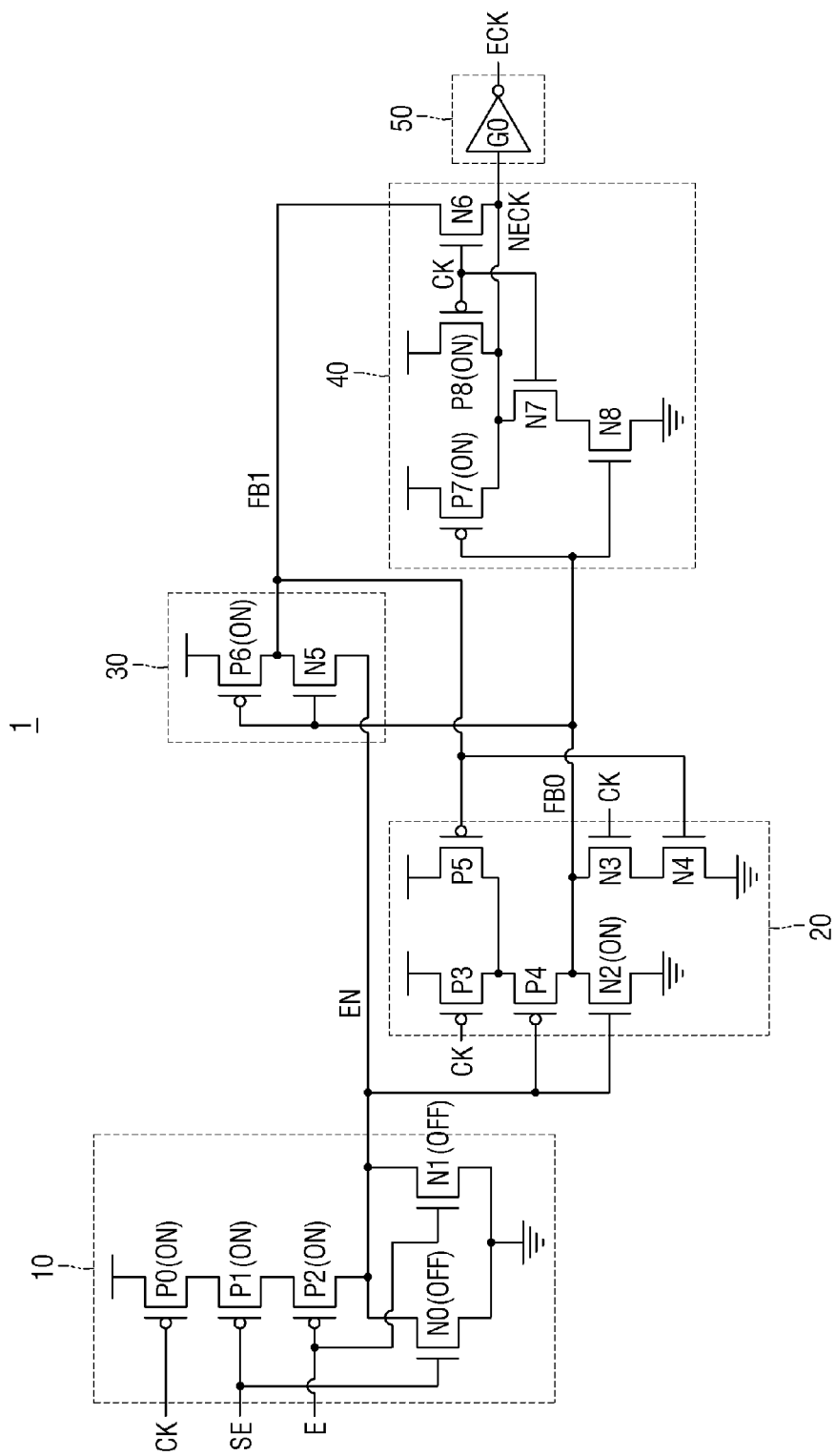
FIGS. 4 to 7 are circuit diagrams for explaining the operation of the semiconductor circuit according to an embodiment of the present disclosure.

Referring to FIG. 4, the first circuit 10 receives the input of each of the clock signal CK, and the enable signal E or the scan enable signal SE (corresponding to the first logic level L). Hereinafter, FIGS. 4 to 7 mainly describe a change in the enable signal E, for convenience of explanation as in FIGS. 2 and 3, assuming that the scan enable signal SE is constant at the first logic level L.

Referring to the first circuit 10, because all the transistors P0, P1 and P2 are turned on and both the transistors N0 and N1 are turned off, the first node EN has a value of the second logic level H.

Referring to the second circuit 20, because the transistor N2 is gated to the voltage level of the first node EN (corresponding to the second logic level H) and is turned on, the second node FB0 has a value of the first logic level L.

Referring to the third circuit 30, because the transistor P6 is gated to the voltage level of the second node FB0 (corresponding to the first logic level L) and is turned on, the third node FB1 has the value of the second logic level H.

Referring to the fourth circuit 40, the transistor P7 is gated to the voltage level of the second node FB0 (corresponding to the first logic level L) and is turned on. The transistor P8 is gated to the voltage level of the clock signal CK (corresponding to the first logic level L) and is turned on. Thus, the fourth node NECK has the value of the second logic level H.

Figure 5:
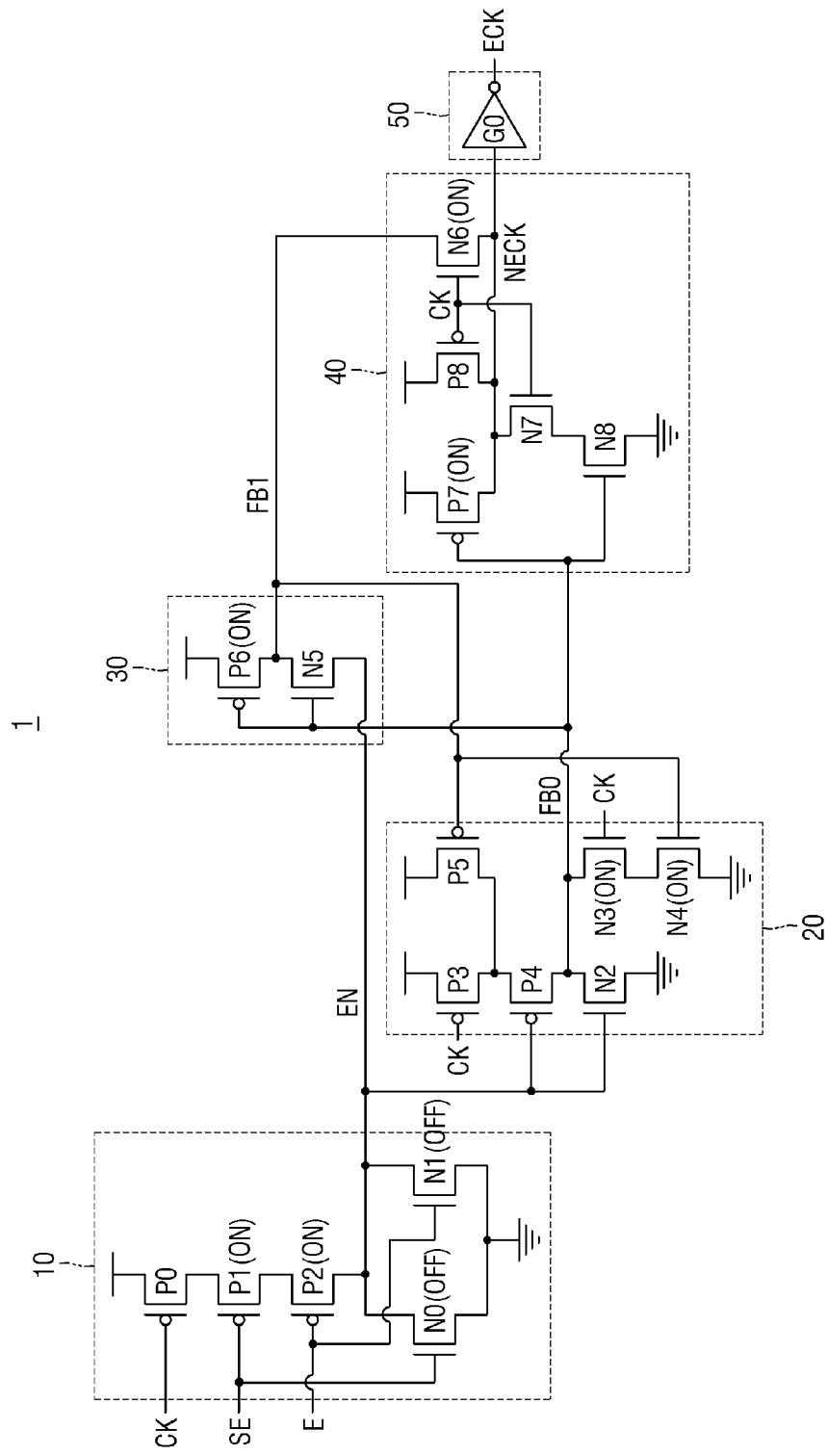

Next, referring to FIG. 5, the clock signal CK transitions from the first logic level L to the second logic level H when the enable signal E is at the first is logic level L.

Referring to the first circuit 10, both the transistors P1 and P2 are still in the turned-on state, and both the transistors N0 and N1 are still in the turned-off state, but the transistor P0 is turned off. The first node EN is in a floating state accordingly.

Referring to the second circuit 20, the transistor N3 is gated to the voltage level of the clock signal CK now changed to the second logic level H and is turned on. The transistor N4 is gated to the voltage level of the third node FB1 which has had the second logic level H in FIG. 4 and is turned on. Thus, the second node FB0 maintains the value of the first logic level L.

Referring to the third circuit 30, because the transistor P6 is gated to the voltage level of the second node FB0 (corresponding to the first logic level L) and maintains the turned-on state, the third node FB1 maintains the value of the second logic level H.

That is, as illustrated in FIG. 4, when the clock signal CK is at the first logic level L, the value of the second node FB0 is determined by the voltage level (i.e., the level of the ground voltage) provided by the transistor N2 gated to the voltage level of the first node EN. The value of the third node FB1 may be determined by the voltage level of the second node FB0. In other words, when the clock signal CK is at the first logic level L, the value of the second node FB0 is determined by the voltage level of the first node EN, and the value of the third node FB1 may be determined by the voltage level of the second node FB0. When the clock signal CK transitions from the first logic level L to the second logic level H, the value of the second node FB0 is maintained by the level voltage of the third node FB1 without change. The value of the third node FB1 may be maintained by the voltage level of the second node FB0 without change.

Referring to the fourth circuit 40, because the transistor P7 is gated to the voltage level of the second node FB0 (corresponding to the first logic level L) and maintains the turned-on state, the fourth node NECK maintains the value of the second logic level H.

Figure 6:
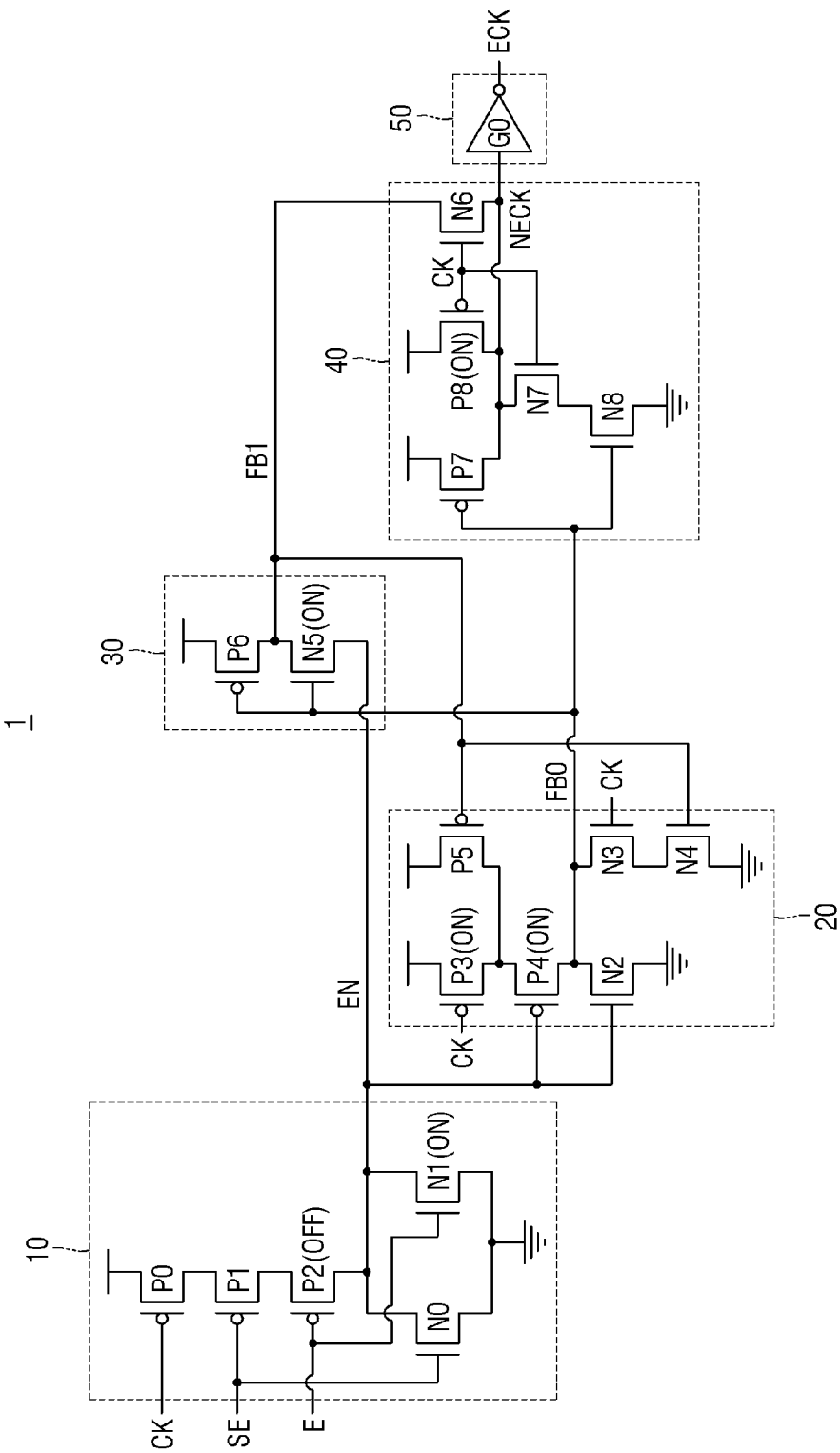

Next, referring to FIG. 6, the first circuit 10 receives the inputs of the clock signal CK (corresponding to the first logic level L), and the enable signal E (corresponding to the second logic level H).

Referring to the first circuit 10, because the transistor P2 is turned off and the transistor N1 is turned on, the first node EN is discharged through the transistor N1 and has the value of the first logic level L.

Referring to the second circuit 20, the transistor P3 is gated to the voltage level of the clock signal CK (corresponding to the first logic level L) and is turned on. The transistor P4 is gated to the voltage level of the first node EN (corresponding to the first logic level L) and is turned on. Thus, the second node FB0 has the value of the second logic level H.

Referring to the third circuit 30, because the transistor N5 is gated to the voltage level of the second node FB0 (corresponding to the second logic level H) and is turned on, the third node FB1 is discharged through the transistor N5 and the transistor N1, and has the value of the first logic level L.

Referring to the fourth circuit 40, the transistor P8 is gated to the voltage level of the clock signal CK (corresponding to the first logic level L) and is turned on, the fourth node NECK has the value of the second logic level H.

Figure 7:
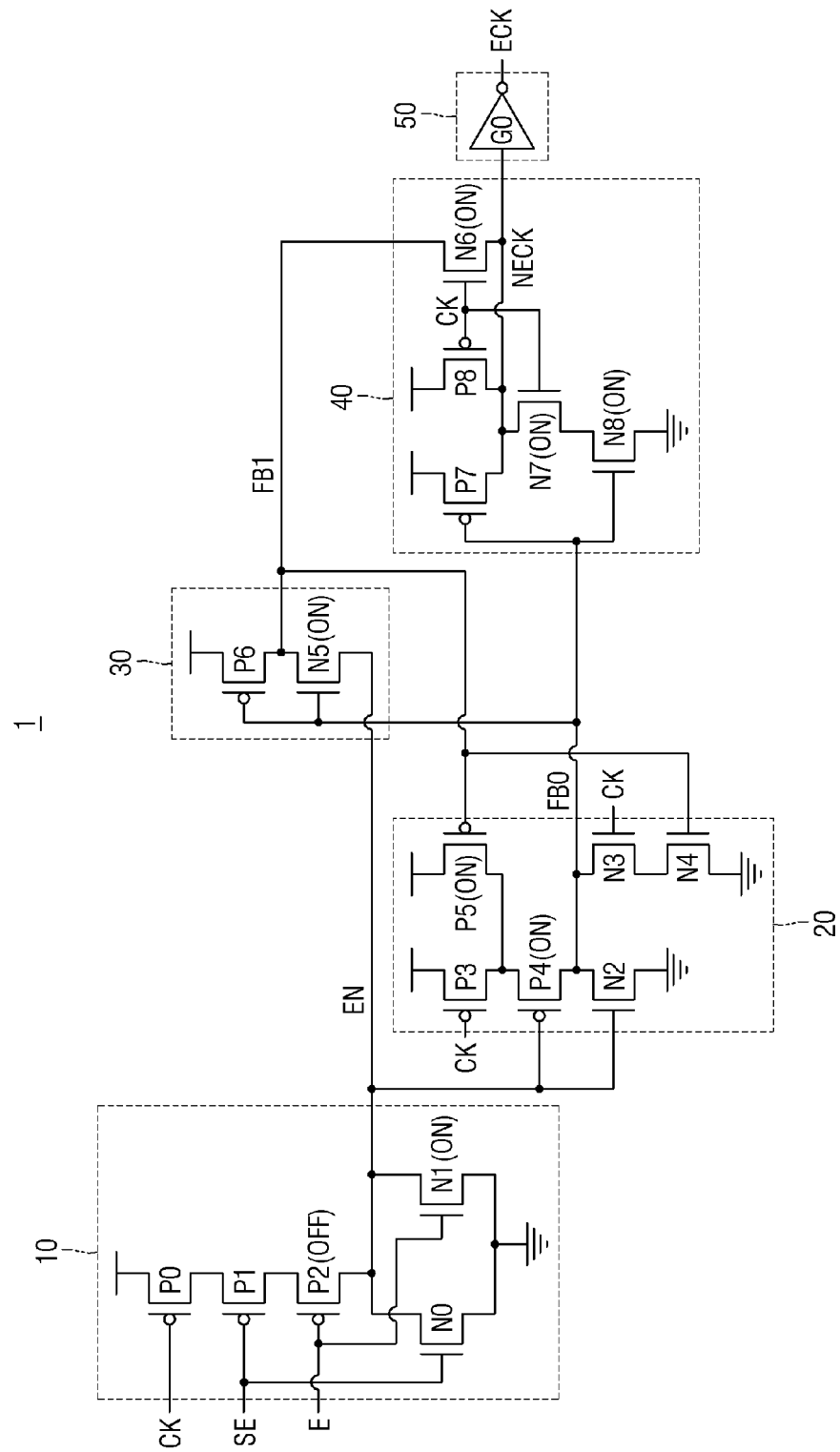

Next, referring to FIG. 7, when the enable signal E is at the second logic level H, the clock signal CK transitions from the first logic level L to the second logic level H.

Referring to the first circuit 10, because the transistor P2 is still in the turned-off state and the transistor N1 is still in the turned-on state, the first node EN is discharged through the transistor N1 and has the value of the first logic level L.

Referring to the second circuit 20, the transistor P5 is turned on by being gated to the voltage level of the third node FB1 that has had the first logic level L in FIG. 6. The transistor P4 is turned on by being gated to the voltage level of the first node EN (corresponding to the first logic level L). Thus, the second node FB0 maintains the value of the second logic level H.

Referring to the third circuit 30, because the transistor N5 is gated to the voltage level of the second node FB0 (corresponding to the second logic level H) and maintains the turned-on state, the third node FB1 is discharged through the transistor N5 and the transistor N1 and maintains the value of the first logic level L.

That is, as illustrated in FIG. 6, when the clock signal CK is at the first logic level L, the value of the second node FB0 is determined by the voltage level (i.e., the level of the power supply voltage) provided by the transistor P3 (gated to the voltage level of the clock signal CK) and the transistor P4 (gated to the voltage level of the first node EN). The value of the third node FB1 may be determined by the voltage level of the second node FB0. In other words, when the clock signal CK is at the first logic level L, the value of the second node FB0 is determined by the voltage level of the first node EN, and the value of the third node FB1 may be determined by the voltage level of the second node FB0. Now, when the clock signal CK transitions from the first logic level L to the second logic level H, the value of the second node FB0 is maintained by the voltage level of the third node FB1 without change, and the value of the third node FB1 may be maintained by the voltage level of the second node FB0 without change.

Referring to the fourth circuit 40, the transistor N8 is gated to the voltage level of the second node FB0 (corresponding to the second logic level H) and is turned on. The transistor N7 is gated to the voltage level of the clock signal CK (corresponding to the second logic level H) and is turned on. Thus, the fourth node NECK is discharged through the transistors N7 and N8 and has the value of the first logic level L.

Here, it is noted that the fourth node NECK is also discharged through the transistor N6, the transistor N5 and the transistor N1. The reason is that the transistor N6 is gated to the voltage level of the clock signal CK (corresponding to the second logic level H) and is turned on to electrically connect the third node FB1 and the fourth node NECK. In other words, the fourth node NECK may also be discharged through the third node FB1 and the first node EN.

As the fourth node NECK is discharged through the two routes, the operation speed of the semiconductor circuit 1 may be significantly improved. In other words, the route in which the fourth node NECK is discharged through the third node FB1 and the first node EN becomes a route that allows the input data of the enable signal E (or the scan enable signal SE) to be rapidly propagated to the node ECK via the first node EN, the third node FB1 and the fourth node NECK.

Further, it is also noted that, after the fourth node NECK is discharged, when the enable signal E transitions from the second logic level H to the first logic level L, the fourth node NECK does not affect the operation of the semiconductor circuit 1. After the fourth node NECK is discharged, even if the enable signal E transitions from the second logic level H to the first logic level L and the transistor N1 is turned off, the first node EN can maintain the state of being discharged by the route formed by the transistors N5, N6, N7 and N8, all of which are turned on and electrically connected to one another.

Figure 8:
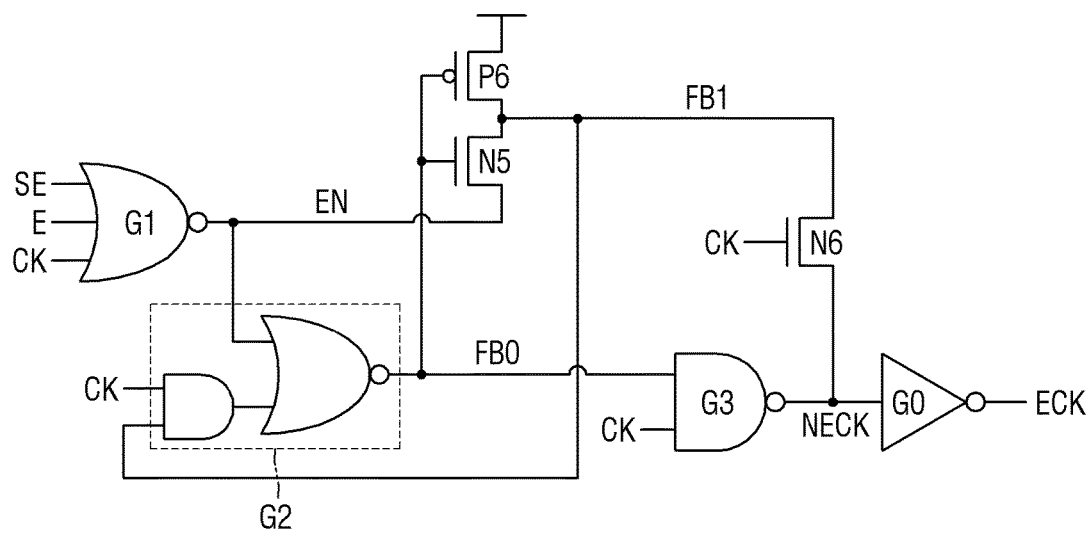
FIG. 8 is a circuit diagram for explaining a semiconductor circuit according to another embodiment of the present disclosure.

FIG. 8 is a circuit diagram for explaining a semiconductor circuit according to another embodiment of the present disclosure.

Referring to FIG. 8, a semiconductor circuit 2 according to another embodiment of the present disclosure includes a first logic gate G1, a second logic gate G2, a third logic gate G3 and transistors P6, N5 and N6. In some embodiments of the present disclosure, the semiconductor circuit 2 may further include an inverter G0 that receives the input of the voltage level of the fourth node NECK and outputs an inverted voltage level.

The first logic gate G1 receives the input of a clock signal CK, an enable signal E or a scan enable signal SE. The first logic gate G1 performs the first logic operation to output an output signal to the first node EN.

Although the first logic gate G1 is indicated by a 3-input NOR logic gate in FIG. 8, the scope of the present disclosure is not limited thereto. That is, the first logic gate G1 may be provided as any form of logic gate that performs a NOR logic operation on the clock signal CK, the enable signal E or the scan enable signal SE.

The second logic gate G2 receives the input of the first output signal of the first logic gate G1, the clock signal CK and the signal of the third node FB1, and performs a second logic operation to output a second output signal to the second node FB0.

Specifically, the second logic gate G2 includes an AND-NOR composite logic gate. The second logic operation may include the AND logic operation on the clock signal CK and the signal of the third node FB1, and a NOR logic operation on the first output signal and the result signal of the AND logic operation.

The third logic gate G3 receives the input of the second output signal of the second logic gate G2 and the clock signal CK. The third logic gate G3 performs the third logic operation to output an output signal to the fourth node NECK.

Specifically, the third logic gate G3 includes a NAND logic gate. The third logic operation may include a NAND logic operation of the second output signal and the clock signal CK.

The transistor P6 is gated to the voltage level of the second output signal to provide the power supply voltage to the third node FB1. The transistor N5 is gated to the voltage level of the second output signal to provide a ground voltage to the third node FB1. That is, the transistors P6 and N5 are connected in series with each other to determine the value of the third node FB1 depending on the voltage level of the second output signal.

The transistor N6 is gated to the voltage level of the clock signal CK to electrically connect the third node FB1 and the fourth node NECK.

In this embodiment, the transistor P6 is a P-type transistor, and the transistors N5 and N6 may be N-type transistors.

Hereinafter, a specific operation of the semiconductor circuit 2 will be described with reference to FIGS. 9 through 12.

FIGS. 9 to 12 are circuit diagrams for explaining the operation of the semiconductor circuit according to another embodiment of the present disclosure.

The first logic gate G1 receives the input of each of the clock signal CK, and the enable signal E or the scan enable signal SE (corresponding to the first logic level L). Hereinafter, FIGS. 9 to 12 mainly describe a change in the enable signal E, assuming that the scan enable signal SE is at the constant first logic level L for convenience of explanation as in FIGS. 2 and 3.

Figure 9:
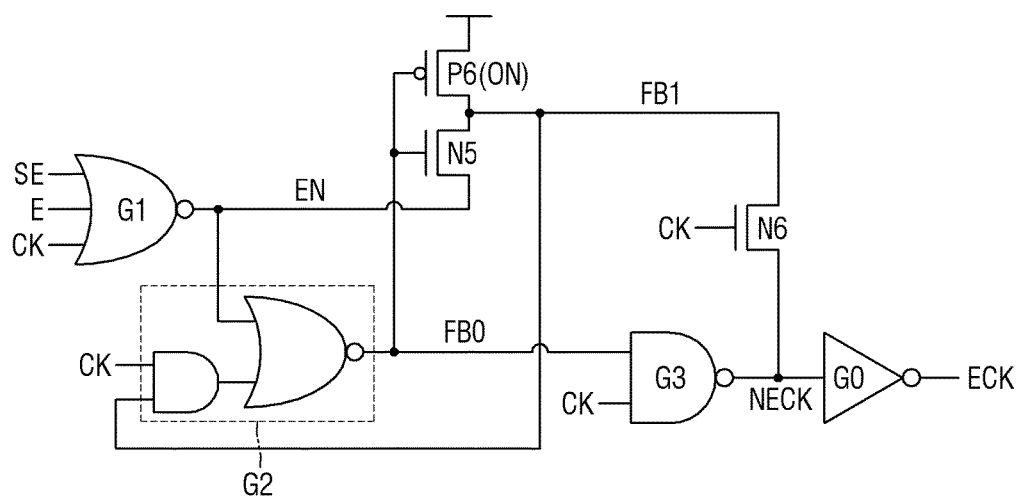
FIGS. 9 to 12 are circuit diagrams for explaining the operation of the semiconductor circuit according to another embodiment of the present disclosure.

In FIG. 9, the first logic gate G1 performs the NOR logic operation on each of the clock signal CK and the enable signal E (corresponding to the first logic level L). The first logic gate G1 outputs a first output signal (corresponding to the second logic level H) to the first node EN. Accordingly, the first node EN has the value of the second logic level H.

The second logic gate G2 performs the AND logic operation on the clock signal CK of the first logic level L and the signal of the third node FB1. The second logic gate G2 performs the NOR logic operation on the result signal of the AND logic operation and the first output signal. However, since the first output signal has the value of the second logic level H, regardless of the values of the logic level of the result signal of the AND logic operation, the second logic gate G2 outputs a second output signal (corresponding to the first logic level L) to the second node FB0. Thus, the second node FB0 has the value of the first logic level L.

The transistors N5 and P6 may correspond to the third circuit 30 of earlier embodiments. Since the third circuit 30 is gated to the voltage level of the second node FB0 (corresponding to the first logic level L) and is turned on, the third node FB1 has the value of the second logic level H.

The third logic gate G3 may perform the NAND operation on the second output signal of the first logic level L and the clock signal CK of the first logic level L. The third logic gate G3 outputs a third output signal (corresponding to the second logic level H) to the fourth node NECK. Thus, the fourth node NECK has the value of the second logic level H.

Figure 10:
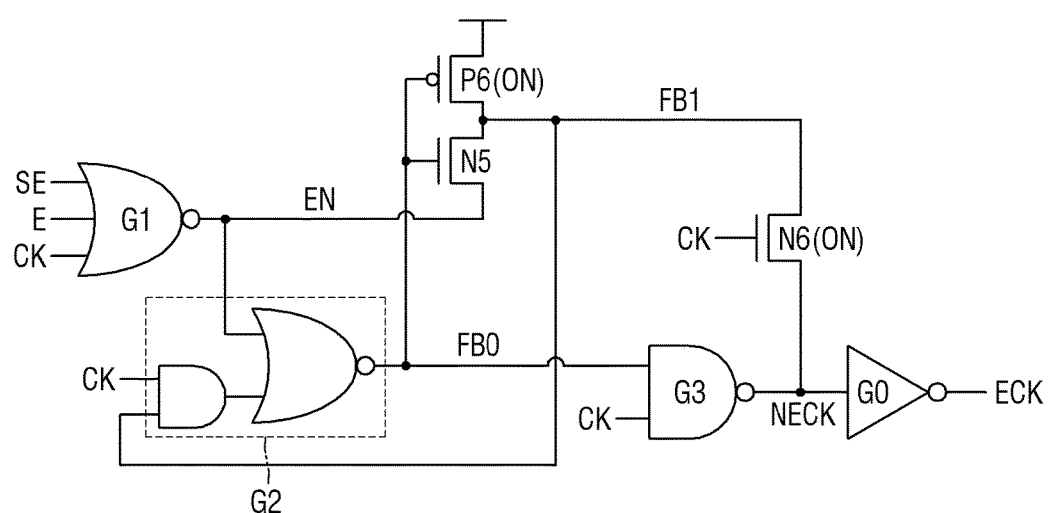

Next, referring to FIG. 10, when the enable signal E is at the first logic level L, the clock signal CK transitions from the first logic level L to the second logic level H.

The first logic gate G1 performs the NOR logic operation on the clock signal CK (corresponding to the second logic level H) and the enable signal E (corresponding to the first logic level L). The first logic gate G1 outputs the first output signal (corresponding to the first logic level L) to the first node EN. Accordingly, the first node EN has the value of the first logic level L.

The second logic gate G2 performs the AND logic operation on the clock signal CK of the second logic level H and the signal of the third node FB1 that has had the second logic level H in FIG. 9. The second logic gate G2 performs the NOR logic operation on the result signal of the AND logic operation and the first output signal (corresponding to the first logic level L). As a result, the second logic gate G2 outputs the second output signal (corresponding to the first logic level L) to the second node FB0. Thus, the second node FB0 maintains the value of the first logic level L.

The transistors N5 and P6 may correspond to the third circuit 30 of earlier embodiments. Referring to the third circuit 30, since the transistor P6 of the third circuit 30 is gated to the voltage level of the second node FB0 (corresponding to the first logic level L) and maintains the turned-on state, the third node FB1 maintains the value of the second logic level H.

That is, when the clock signal CK transitions from the first logic level L to the second logic level H, the value of the second node FB0 is maintained by the voltage level of the third node FB1 without change. The value of the third node FB1 may be maintained by the voltage level of the second node FB0 without change.

The third logic gate G3 performs the NAND operation on the second output signal of the first logic level L and the clock signal CK of the second logic level H. The third logic gate G3 outputs the third output signal (corresponding to the second logic level H) to the fourth node NECK. Accordingly, the fourth node NECK maintains the value of the second logic level H.

Figure 11:
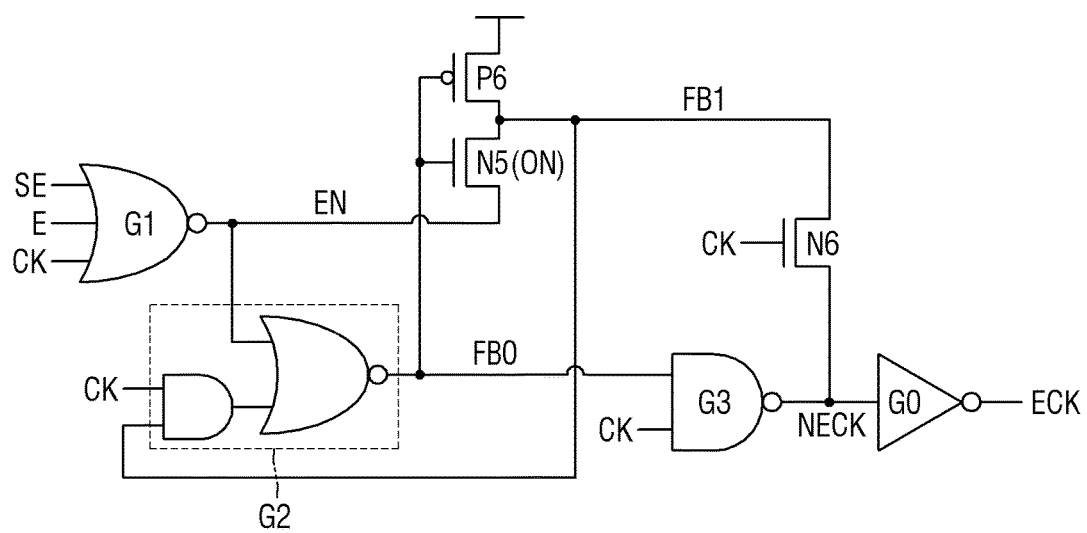

Next, referring to FIG. 11, the first logic gate G1 receives the inputs of the clock signal CK (corresponding to the first logic level L) and the enable signal E (corresponding to the second logic level H).

The first logic gate G1 performs the NOR logic operation on the enable signal E (corresponding to the second logic level H) and the clock signal CK (corresponding to the first logic level L). The first logic gate G1 outputs the first output signal (corresponding to the first logic level L) to the first node EN. Thus, the first node the EN has the value of the first logic level L.

The second logic gate G2 performs the AND logic operation on the clock signal CK of the first logic level L and the signal of the third node FB1. The second logic gate G2 performs the NOR logic operation on the result signal of the AND logic operation and the first output signal. However, since the clock signal CK has the value of the first logic level L, the result signal of the AND logic operation has the value of the first logic level L. Thus, the second logic gate G2 outputs the second output signal (corresponding to the second logic level H) to the second node FB0. Thus, the second node FB0 has the value of the second logic level H.

As noted above, transistors N5 and P6 may correspond to the third circuit 30 of earlier embodiments. Referring to the third circuit 30, since the transistor N5 of the third circuit 30 is gated to the voltage level of the second node FB0 (corresponding to the second logic level H) and is turned on, the third node FB1 has the value of the first logic level L.

The third logic gate G3 performs the NAND operation on the second output signal of the second logic level H and the clock signal CK of the first logic level L. The third logic gate G3 outputs the third output signal (corresponding to the second logic level H) to the fourth node NECK. Thus, the fourth node NECK has the value of the second logic level H.

Figure 12:
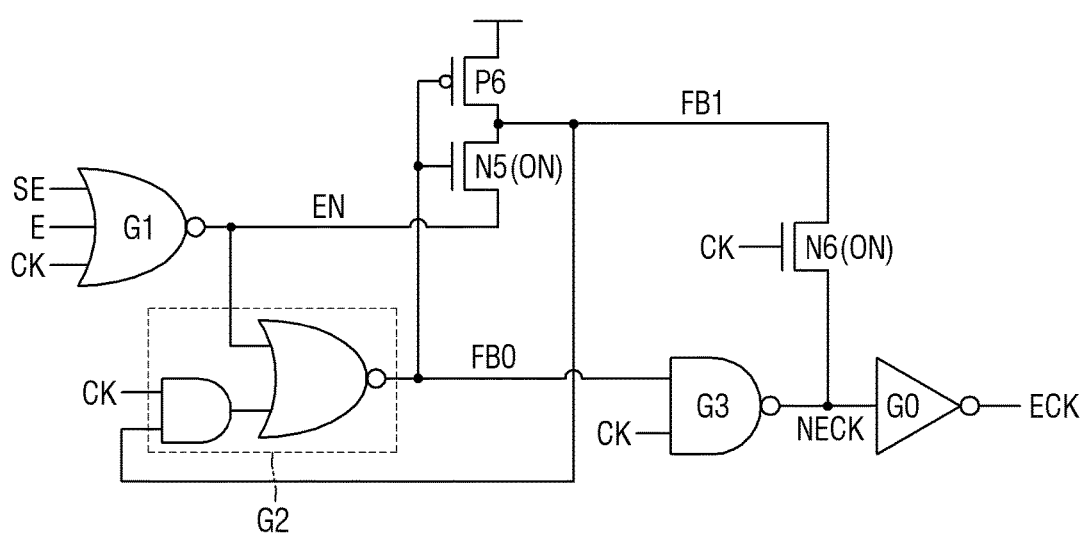

Next, referring to FIG. 12, when the enable signal E is at the second logic level H, the clock signal CK transitions from the first logic level L to the second logic level H.

The first logic gate G1 performs the NOR logic operation on each of the clock signal CK (corresponding to the second logic level H) and the enable signal E (corresponding to the second logic level H). The first logic gate G1 outputs the first output signal (corresponding to the first logic level L) to the first node EN. Thus, the first node EN has the value of the first logic level L.

The second logic gate G2 performs the AND logic operation on the clock signal CK (corresponding to the second logic level H) and the signal of the third node FB1 which has had the first logic level L in FIG. 11. The second logic gate G2 performs the NOR logic operation on the result signal of the AND logic operation and the first output signal (corresponding to the first logic level L). As a result, the second logic gate G2 outputs the second output signal (corresponding to the second logic level H) to the second node FB0. Thus, the second node FB0 maintains the value of the second logic level H.

As noted above, transistors N5 and P6 may correspond to the third circuit 30 of earlier embodiments. Referring to the third circuit 30, since the transistor N5 of the third circuit 30 is gated to the voltage level of the second node FB0 (corresponding to the second logic level H) and maintains the turned-on state, the third node FB1 maintains the value of the first logic level L.

That is, when the clock signal CK transitions from the first logic level L to the second logic level H, the value of the second node FB0 is maintained by the voltage level of the third node FB1 without change. The value of the third node FB1 may be maintained by the voltage level of the second node FB0 without change.

The third logic gate G3 performs the NAND operation on the second output signal of the second logic level H and the clock signal CK of the second logic level H. The third logic gate G3 outputs the third output signal (corresponding to the first logic level L) to the fourth node NECK. Thus, the fourth node NECK has the value of the first logic level L.

Here, it is noted that the fourth node NECK is also discharged through the transistor N6 and the transistor N5. The reason is that the transistor N6 is gated to the voltage level of the clock signal CK (corresponding to the second logic level H) and is turned on to electrically connect the third node FB1 and the fourth node NECK. In other words, the fourth node NECK may also be discharged through the third node FB1 and the first node EN.

As the fourth node NECK is discharged through the two routes, the operation speed of the semiconductor circuit 2 according to various embodiments of the present disclosure can be significantly improved. In other words, the route in which the fourth node NECK is discharged through the third node FB1 and the first node EN becomes a route that allows the input data of the enable signal E (or the scan enable signal SE) to be rapidly propagated to the node ECK via the first node EN, the third node FB1 and the fourth node NECK.

The aforementioned semiconductor circuits 1 and 2 may also be described as including the following nodes.

The semiconductor circuits 1 and 2 include a first node EN, a second node FB0, a third node FB1, and a fourth node NECK. The first node EN has a logic level value different from the logic level of the enable signal E or the scan enable signal SE when the clock signal CK is at the first logic level L. The second node FB0 has a value determined by the logic level of the first node EN when the clock signal CK is at the first logic level L and determined by the logic level of the third node FB1 when the clock signal CK is at the second logic level H. The third node FB1 has a value determined by the logic level of the second node FB0. The fourth node NECK has a value determined by the logic level of the second node FB0 when the clock signal CK is at the second logic level H.

Here, the fourth node NECK may be discharged through a transistor N5 and a transistor N6. The transistor N5 is gated to the voltage level of the second node FB0 to provide the ground voltage to the fourth node NECK. The transistor N6 is gated to the voltage level of the clock signal CK to electrically connect the third node FB1 and the fourth node NECK.

When the enable signal E or the scan enable signal SE is at the first logic level L, the second node FB0 may have the first logic level L and the third node FB1 may have the second logic level H. Further, the fourth node NECK may have the second logic level H. This is described, for example, in the embodiments of FIGS. 9 and 10.

When the enable signal E or the scan enable signal SE is at the second logic level H, the second node FB0 may have the second logic level H and the third node FB1 may have the first logic level L. Here, the third node FB1 may be discharged through the first node EN. Further, the fourth node NECK may have the second logic level H when the clock signal CK is at the first logic level L, as shown in the embodiment of FIG. 11. The fourth node NECK may have first logic level L when the clock signal CK is at the second logic level H, as shown in the embodiment of FIG. 12. Here, the fourth node NECK may be discharged through the transistor N6, the third node FB1 and the first node the EN, when the clock signal CK is at the second logic level H.

Figure 13:
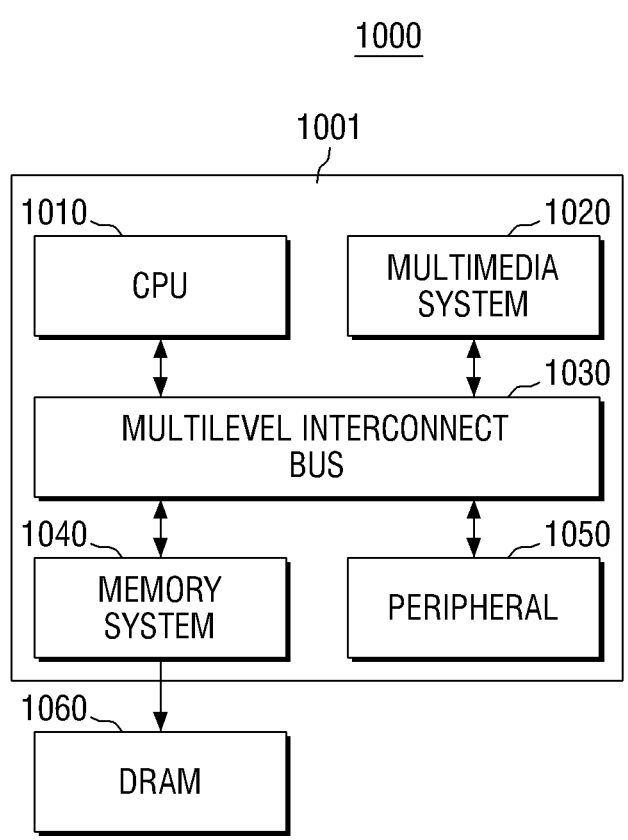
FIG. 13 is a block diagram of a SoC system that includes the semiconductor circuit according to the embodiments of the present disclosure.

FIG. 13 is a block diagram of a system on chip (SoC) system that includes the semiconductor circuits according to embodiments of the present disclosure.

Referring to FIG. 13, the SoC system includes an application processor 1001 and a DRAM 1060.

The application processor 1001 may include a central processing unit 1010, a multimedia system 1020, a bus 1030, a memory system 1040, and a peripheral circuit 1050.

The central processing unit 1010 may perform operations needed to drive the SoC system 1000. In some embodiments of the present disclosure, the central processing unit 1010 may be configured as a multi-core environment that includes multiple cores.

The multimedia system 1020 may be used to perform various multimedia functions in the SoC system 1000. The multimedia system 1020 may include a 3D engine module, a video codec, a display system, a camera system, a post-processor, etc.

The bus 1030 may be used for data communication among the central processing unit 1010, the multimedia system 1020, the memory system 1040 and the peripheral circuit 1050. In some embodiments of the present disclosure, the bus 1030 may have a multilayer structure. Specifically, the bus 1030 may be, but is not limited to, a multilayer advanced high-performance bus (AHB) or a multilayer advanced extensible interface (AXI).

The memory system 1040 may provide an environment needed for the application processor 1001 to be connected to an external memory (e.g., the DRAM 1060) and operate at high speed. In some embodiments of the present disclosure, the memory system 1040 may include a separate controller (e.g., a DRAM controller) needed to control the external memory (e.g., the DRAM 1060).

The peripheral circuit 1050 may provide an environment needed for the SoC system 1000 to smoothly connect to an external device (e.g., mainboard). Accordingly, the peripheral circuit 1050 may include various interfaces that enable the external device connected to the SoC system 1000 to be compatible with the SoC system 1000.

The DRAM 1060 may function as an operating memory needed for the operation of the application processor 1001.

In some embodiments of the present disclosure, the DRAM 1060 may be placed outside the application processor 1001. Specifically, the DRAM 1060 may be packaged with the application processor 1001 in the form of package on package (PoP).

Any one of the semiconductor circuits according to the above-described embodiments of the present disclosure can be provided as at least one of the constituent elements of the SoC system 1000.

Figure 14:
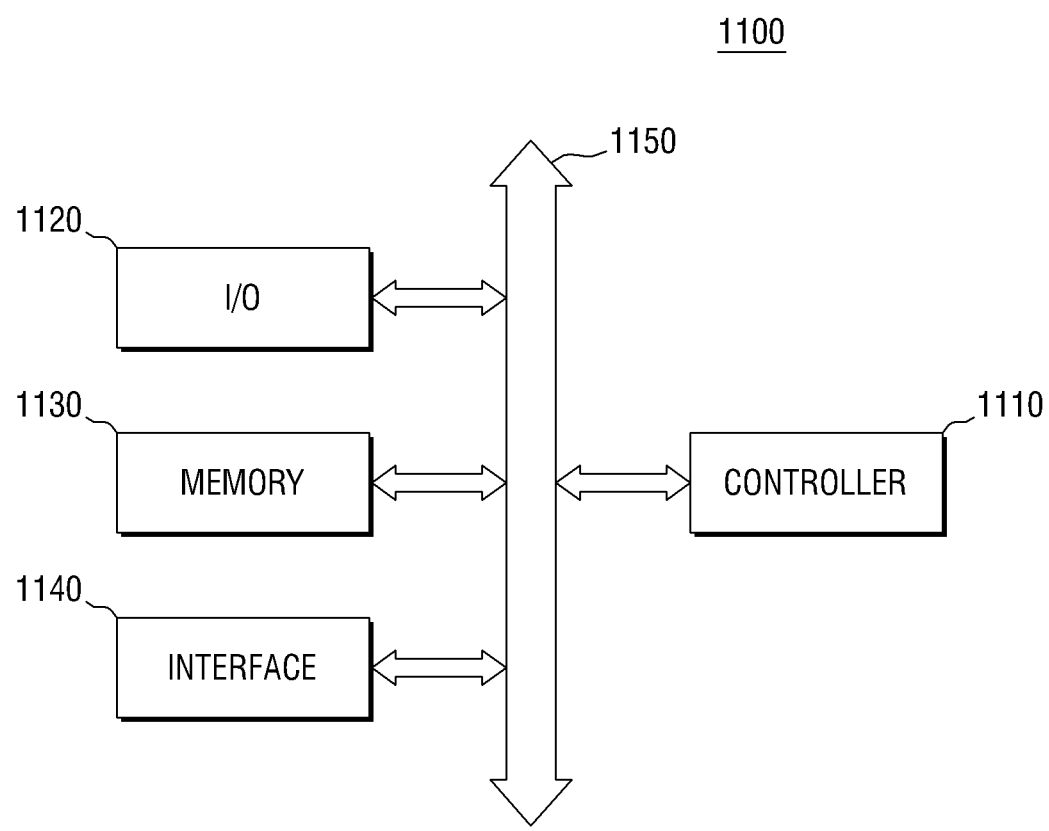
FIG. 14 is a block diagram of an electronic system that includes the semiconductor circuit according to the embodiments of the present disclosure.

FIG. 14 is a block diagram illustrating an electronic system that includes a semiconductor circuit according to the embodiments of the present disclosure.

Referring to FIG. 14, the electronic system 1100 according to embodiments of the present disclosure may include a controller 1110, an input/output (I/O) device 1120, a memory device 1130, an interface 1140 and a bus 1150. The controller 1110, the I/O device 1120, the memory device 1130 and/or the interface 1140 may be connected to one another through the bus 1150. The bus 1150 serves as a path for transmitting data.

The controller 1110 may include at least one of a microprocessor, a digital signal processor, a microcontroller and logic devices capable of performing similar functions to those of a microprocessor, a digital signal processor and a microcontroller. The I/O device 1120 may include a keypad, a keyboard and a display device. The memory device 1130 may store data and/or commands. The interface 1140 may serve to transmit data to or receive data from a communication network. The interface 1140 may be a wired or wireless interface. In an example, the interface 1140 may include an antenna or a wired or wireless transceiver.

Although not illustrated in the drawing, the electronic system 1100 may be an operating memory for improving the operation of the controller 1110, and may also include a high-speed DRAM or SRAM.

The electronic system 1100 may be applied to a personal digital assistant (PDA), a portable computer, a web tablet, a wireless phone, a mobile phone, a digital music player, a memory card or all types of electronic products capable of transmitting or receiving information in a wireless environment.

At least one of the constituent elements of the electronic system 1100 may adopt at least one of the semiconductor circuits according to the above-described embodiments of the present disclosure.

Figure 15:
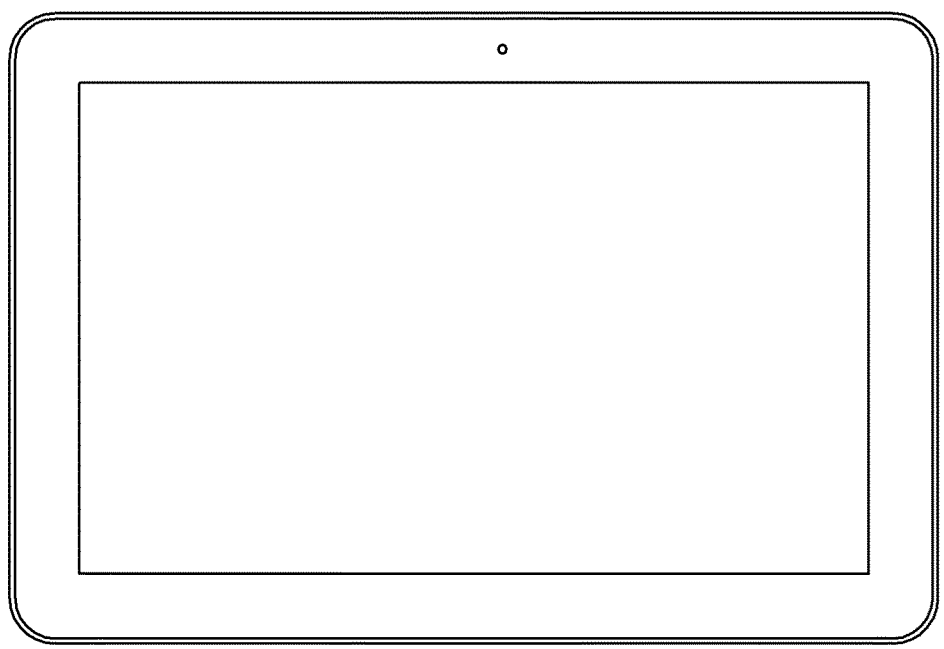
FIGS. 15 to 17 are exemplary semiconductor systems to which semiconductor circuits according to some embodiments of the present disclosure apply.
Figure 16:
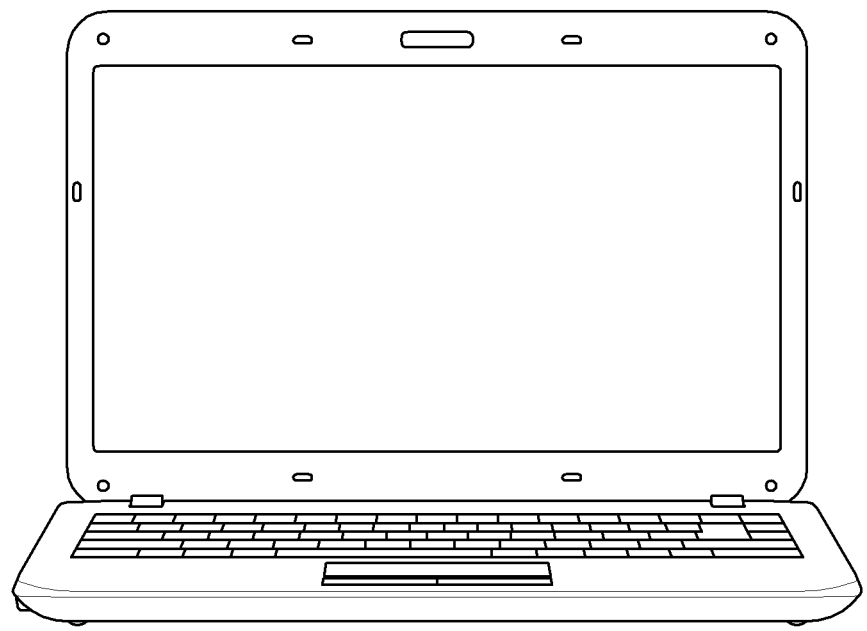
Figure 17:
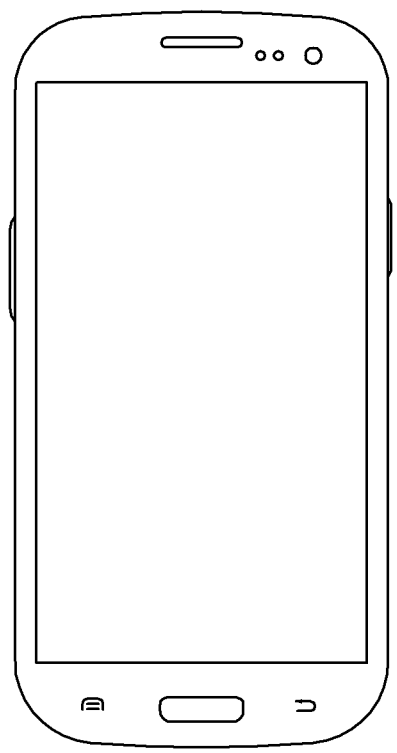

FIGS. 15 through 17 are diagrams illustrating examples of a semiconductor system to which the semiconductor circuits according to some embodiments of the present disclosure can be applied.

FIG. 15 illustrates a tablet PC 1200, FIG. 16 illustrates a notebook computer 1300, and FIG. 17 illustrates a smartphone 1400. At least one of the semiconductor circuits according to the embodiments of the present disclosure may be used in the tablet PC 1200, the notebook computer 1300 and the smartphone 1400.

Further, those skilled in the art will recognize that the semiconductor circuits of some embodiments of the present disclosure may also be applied to other IC devices other than those set forth herein. That is, while the tablet PC 120, the notebook computer 1300, and the smartphone 1400 have been described above as examples of a semiconductor system according to the present embodiment, the examples of the semiconductor system according to the present embodiment are not limited to the tablet PC 1200, the notebook computer 1300, and the smartphone 1400. In some embodiments of the present disclosure, the semiconductor system may be provided as a computer, an ultra mobile PC (UMPC), a work station, a net-book computer, a personal digital assistant (PDA), a portable computer, a wireless phone, a mobile phone, an e-book, a portable multimedia player (PMP), a portable game console, a navigation device, a black box, a digital camera, a 3-dimensional television set, a digital audio recorder, a digital audio player, a digital picture recorder, a digital picture player, a digital video recorder, a digital video player, etc.

While the Semiconductor Circuit described herein has been particularly shown and described with reference to exemplary embodiments thereof, it will be understood by those of ordinary skill in the art that various changes in form and detail may be made therein without departing from the spirit and scope of the present disclosure as defined by the following claims. The exemplary embodiments should be considered in a descriptive sense only and not for purposes of limitation.

What is claimed is:

1. A semiconductor circuit, comprising:
   a first circuit that determines a value of a first node based on a voltage level of a clock signal, and a voltage level of an enable signal or a voltage level of a scan enable signal;
   a second circuit that determines a value of a second node based on a voltage level of the first node and the voltage level of the clock signal;
   a third circuit that determines a value of a third node based on a voltage level of the second node; and
   a fourth circuit that determines a value of a fourth node based on the voltage levels of the second node and the clock signal,
   wherein the third circuit comprises a first transistor and a second transistor connected in series with each other and gated to the voltage level of the second node to determine the value of the third node, and
   wherein the fourth circuit comprises a third transistor that is gated to the voltage level of the clock signal to electrically connect the third node and the fourth node.

2. The semiconductor circuit of claim 1,
   wherein the first circuit comprises a fourth transistor that is gated to the voltage level of the clock signal to provide a power supply voltage, a fifth transistor that is connected in series with the fourth transistor and is gated to the voltage level of the enable signal to provide the power supply voltage to the first node, and a sixth transistor that is gated to the voltage level of the enable signal to provide a ground voltage to the first node.

3. The semiconductor circuit of claim 1,
   wherein the first circuit further comprises a fourth transistor that is gated to the voltage level of the clock signal to provide a power supply voltage; a fifth transistor that is connected in series with the fourth transistor and is gated to the voltage level of the scan enable signal to provide the power supply voltage to the first node; and a sixth transistor that is gated to the voltage level of the scan enable signal to provide a ground voltage to the first node.

4. The semiconductor circuit of claim 1,
   wherein the second circuit comprises a fourth transistor that is gated to the voltage level of the clock signal to provide a power supply voltage; a fifth transistor that is connected in parallel with the fourth transistor and is gated to a voltage level of the third node to provide the power supply voltage; a sixth transistor that is connected in series with the fourth transistor and the fifth transistor and is gated to the voltage level of the first node to provide the power supply voltage to the second node; a seventh transistor that is gated to the voltage level of the first node to provide a ground voltage to the second node; an eighth transistor that is gated to the voltage level of the third node to provide the ground voltage; and a ninth transistor that is connected in series with the eighth transistor and is gated to the voltage level of the clock signal to provide the ground voltage to the second node.

5. The semiconductor circuit of claim 4, wherein, when the voltage level of the clock signal is a first logic level, the value of the second node is determined by a voltage level provided by at least one of the fourth transistor, the sixth transistor and the seventh transistor, and the value of the third node is determined by the voltage level of the second node.

6. The semiconductor circuit of claim 5, wherein, when the voltage level of the clock signal transitions from the first logic level to a second logic level, the value of the second node is maintained by the voltage level of the third node, and the value of the third node is maintained by the voltage level of the second node.

7. The semiconductor circuit of claim 1, wherein the fourth circuit comprises a fourth transistor that is gated to the voltage level of the second node to provide a power supply voltage to the fourth node; a fifth transistor that is connected in parallel to the fourth transistor and is gated to the voltage level of the clock signal to provide the power supply voltage to the fourth node; a sixth transistor that is gated to the voltage level of the second node to provide a ground voltage; and a seventh transistor that is connected in series with the sixth transistor to provide the ground voltage to the fourth node.

8. A semiconductor circuit, comprising:
a first node that has a logic level value different from a logic level of an enable signal or a logic level of a scan enable signal, when a clock signal is at a first logic level;
a second node in which a value is determined by the logic level of the first node when the clock signal is at the first logic level, and the value is maintained by a logic level of a third node when the clock signal is at a second logic level;
a third node in which a value is determined by the logic level of the second node; and
a fourth node in which a value is determined by the logic level of the second node when the clock signal is at the second logic level,
wherein the fourth node is discharged through a first transistor gated to a voltage level of the second node to provide a ground voltage to the fourth node, and a second transistor gated to a voltage level of the clock signal to electrically connect the third node and the fourth node.

9. The semiconductor circuit of claim 8, wherein, when the enable signal or the scan enable signal is at the first logic level, the second node has the first logic level and the third node has the second logic level.

10. The semiconductor circuit of claim 9, wherein the fourth node has the second logic level.

11. The semiconductor circuit of claim 8, wherein, when the enable signal or the scan enable signal is at the second logic level, the second node has the second logic level and the third node has the first logic level.

12. The semiconductor circuit of claim 11, wherein the third node is discharged through the first node.

13. The semiconductor circuit of claim 11, wherein the fourth node has the second logic level when the clock signal is at the first logic level, and the fourth node has the first logic level when the clock signal is at the second logic level.

14. The semiconductor circuit of claim 13, wherein the fourth node is discharged through the second transistor, the third node and the first node, when the clock signal is at the second logic level.

15. A semiconductor circuit, comprising:
a first logic gate that receives input of a clock signal, an enable signal or a scan enable signal and performs a first logic operation to output a first output signal to a first node;
a second logic gate that receives input of the first output signal of the first logic gate, the clock signal and a signal of a third node and performs a second logic operation to output a second output signal to a second node;
a first transistor and a second transistor that are gated to a voltage level of the second output signal of the second logic gate and connected in series with each other to determine a value of the third node;
a third logic gate that receives input of the second output signal of the second logic gate and the clock signal and performs a third logic operation to output a third output signal to a fourth node; and
a third transistor that is gated to a voltage level of the clock signal to electrically connect the third node and the fourth node.

16. The semiconductor circuit of claim 15, wherein the first logic operation comprises a NOR logic operation on the clock signal, the enable signal or the scan enable signal.

17. The semiconductor circuit of claim 15, wherein the second logic gate comprises an AND-NOR composite logic gate, and
wherein the second logic operation comprises an AND logic operation on the clock signal and the signal of the third node, and a NOR logic operation on the first output signal and a result signal of the AND logic operation.

18. The semiconductor circuit of claim 15, wherein the third logic gate comprises a NAND logic gate, and
wherein the third logic operation comprises a NAND logic operation on the second output signal and the clock signal.

19. The semiconductor circuit of claim 15, wherein, when the voltage level of the clock signal is at first logic level, a value of the second node is determined by a voltage level of the first node, and the value of the third node is determined by a voltage level of the second node.

20. The semiconductor circuit of claim 19, wherein, when the voltage level of the clock signal transitions from the first logic level to the second logic level, the value of the second node is maintained by a voltage level of the third node, and the value of the third node is maintained by the voltage level of the second node.

* * * * *